United States Patent [19]
Johnson et al.

[11] Patent Number: 4,829,481
[45] Date of Patent: May 9, 1989

[54] DEFECTIVE ELEMENT DISABLING CIRCUIT HAVING A LASER-BLOWN FUSE

[75] Inventors: Mark G. Johnson, Dallas; Ronald T. Taylor, Irving, both of Tex.

[73] Assignee: SGS-Thomson Microelectronics, Inc., Carrollton, Tex.

[21] Appl. No.: 112,255

[22] Filed: Oct. 22, 1987

Related U.S. Application Data

[63] Continuation of Ser. No. 767,404, Aug. 20, 1985, abandoned.

[51] Int. Cl.⁴ .................... G11C 7/00; G11C 29/00; H03K 19/094
[52] U.S. Cl. .................... 365/200; 365/230.06; 307/451; 307/202.1
[58] Field of Search ............ 365/200, 230, 189; 307/451, 469, 202.1, 441, 449

[56] References Cited

U.S. PATENT DOCUMENTS 4,587,638  5/1986  Isobe et al. .................. 365/200
4,606,013  8/1986  Yoshimoto .................... 365/200

FOREIGN PATENT DOCUMENTS 0125846  7/1983  Japan ........................ 365/200

Primary Examiner—Stuart N. Hecker
Assistant Examiner—Glenn A. Gossage
Attorney, Agent, or Firm—Roland Plottel

[57] ABSTRACT

A decoder circuit for disabling a defective element in a circuit having redundant replacement elements employs a fuse on a signal path through the decoder circuit from a selection device to a low-impedance output device and a weak default circuit, such as a pull-up transistor, for forcing the state of the output circuit to a low-impedance default state when the fuse is blown.

1 Claim, 3 Drawing Sheets

FIG. 2
PRIOR ART
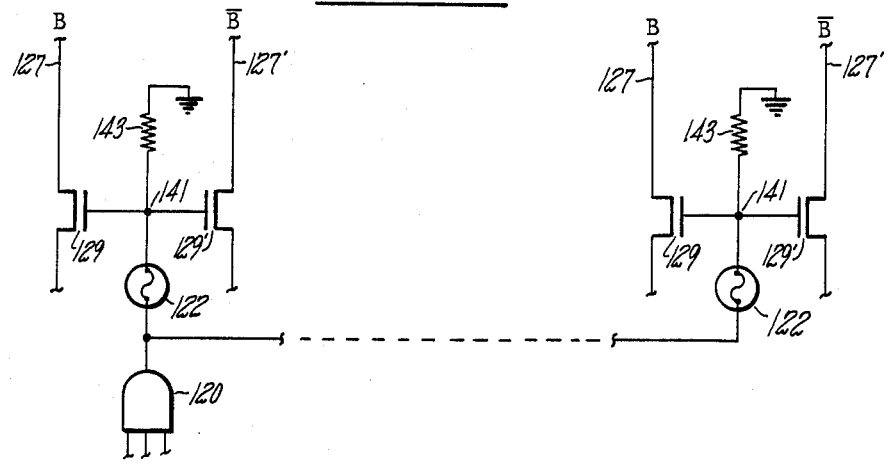
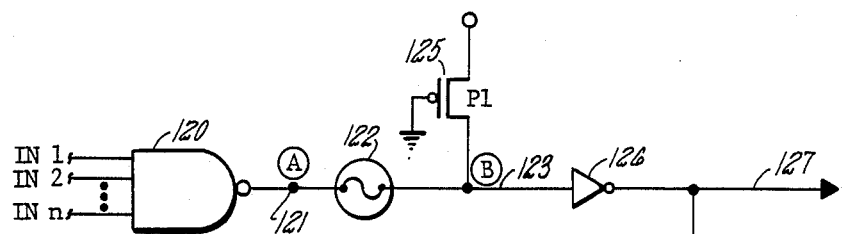
FIG. 3

4,829,481

DEFECTIVE ELEMENT DISABLING CIRCUIT HAVING A LASER-BLOWN FUSE

This application is a continuation of application Ser. No. 767,404, filed 8/20/85, now abandoned.

Description

1. Technical Field

The field of the invention is that of integrated circuits having redundant elements, in particular memory circuits having redundant rows or columns.

2. Background Art

The use of redundant rows or columns of elements in integrated circuit memories is well known in the art. A conventional method of implementing such redundancy is shown in an article by K. Kokkonen, P. O. Sharp, R. Albers, J. P. Dishaw, F. Louie and R. J. Smith titled "Redundancy Techniques for Fast Static Rams", Digest of Technical Papers, IEEE 1981 International Solid State Circuits Conference, pages 80-81. In this conventional approach a redundant activation circuit recognizes the address of a defective element, through laser programming or an equivalent method, and sends a disable signal ("NED") that electrically disables the decoders of all the regular elements in the memory array. The defective element is thus disabled, as well as all the other elements. The spare row or column that was programmed to recognize that particular address is then free to generate its output signal. The advantage of this method is that only one decoder needs to be programmed for each defect—the decoder on the spare row or column. There is no need to program the defective row or column to disable it because all rows or columns are electrically disabled. A well know disadvantage of this method is that the disable signal (NED) must drive a large capacitance since it is connected to all of the rows and columns, not just to a defective one. There is thus a larger or longer response time for repaired elements than there is for normal elements and the specification of the circuit must be altered to allow for this extra response time.

Another prior art circuit, shown in a paper by Smith, Bateman, Sharp, Dishaw and Smudski, FAM 18.3, ISSCC 1982, pages 252, 253, teaches away from the present invention in that it teaches the use of a NED approach for rows together with a column-disabling system for disabling only one out of a set of eight selected columns that employs an extremely large pulldown resistor, having a value of 1000 megohms, in a series connection with a fuse connected to the gate of a column pass transistor.

DISCLOSURE OF INVENTION

The invention relates to a decoder circuit for disabling a defective element in a circuit where there are redundant elements available. The decoder scheme employs a fuse on a signal path through the decoder and a default circuit for controlling the output state of the decoder when the signal path is in a high impedance state, such as when a laser-blown fuse is open.

A feature of the invention is the suppression of noise coupled into the circuit by the provision of a low-impedance path from the enabling line to either ground or VCC.

BRIEF DESCRIPTION OF DRAWINGS

FIG. 2 illustrates another prior art method.
FIG. 3 illustrates an embodiment of the invention.

BEST MODE OF CARRYING OUT THE INVENTION

Figure 1:
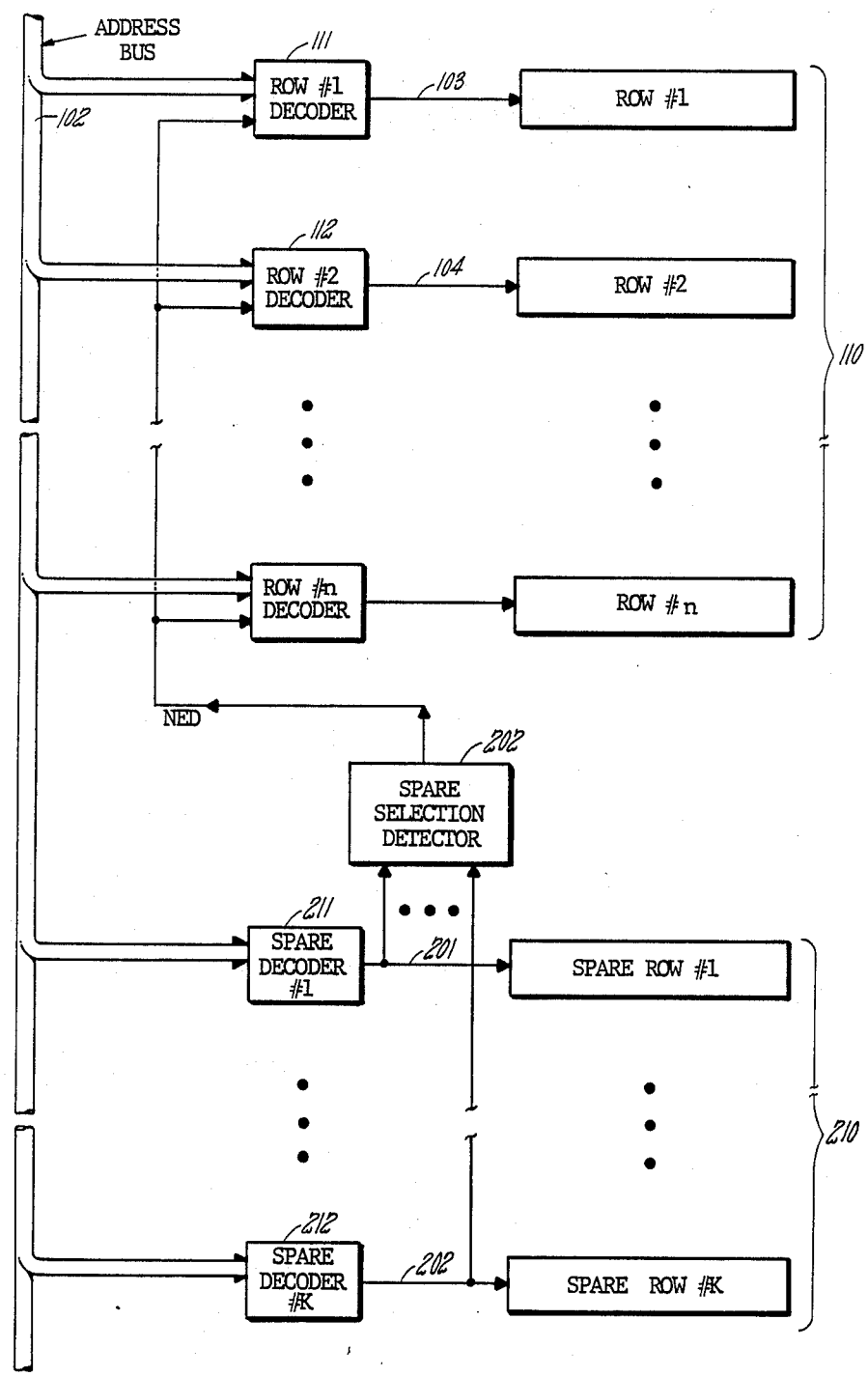
FIG. 1 illustrates a prior art method of controlling redundant elements.

In FIG. 1, a prior art embodiment referred to above is illustrated, in which a memory array indicated by the bracket labeled 110 and a redundant set of rows indicated by the bracket labeled 210 are both connected to a set of decoders and thus to a common address bus 102. The address bus transmits addresses to a set of conventional decoders, indicated by 111 and 112 in the figure, and spare decoders indicated by the numerals 211 and 212. Each decoder, which is conventional in the art, will respond to its particular address by activating an output line that will enable the row or column to which it is connected. When one row is defective, that row must be disabled and one of the spare rows must be enabled to respond to the correct address. Spare selection detector circuit 202 in the figure has the form illustrated in the above reference and responds to any activation signal from a spare decoder on one of lines 201 or 202 in the drawing to generate a normal element disable signal, referred to as NED, that disables all of the decoders in the regular array. The disadvantage of this approach, as was discussed above, is that circuit 202 must drive a large capacitive load because of the many elements that are connected to it, and thus the response of the memory in the case of a defective row takes a longer time than it does for the response to a normal row.

FIG. 2 shows a portion of another prior art circuit that is used in the particular case of a by-8 memory in which a single column select signal enables a column in each of eight blocks. Only two blocks are shown in the drawing for simplicity. When only one column is defective, it is necessary to disable only one column out of the eight selected columns in order to use the remaining seven columns. This is accomplished by the circuit shown, in which a decoder (120) output is connected directly to eight fuses 122, each of which is in series with the gates of a pair of pass transistors 129 and 129′ that are connected to BIT and BIT lines 127 and 127′. The (single) fuse connected to the defective column will be blown. Note that the fuse is not series-connected to the column or row enable line, but only to two transistor gates. Because the decoder must be on pitch with two lines in this case, it must be physically small, and thus can pass only a relatively small amount of current. The single RC time constant resulting from the nontrivial resistance of the fuse and the gate capacitance of the relatively large pass transistors degrades the switching time for this arrangement. Another drawback of this circuit is that the extremely high impedance of the 1000 megohm path to ground through resistor 143 makes this circuit susceptible to noise that is inevitably coupled in to node 141 between the pass transistor gate and the fuse.

Referring now to FIG. 3, there is illustrated an embodiment of the invention in which one conventional row decoder, indicated by numeral 120, and having the form of a conventional NAND gate with an output node 121 responds to an address on the address bus. The signal path in this case is from decoder 120 through fuse 122 to control node 123 then through inverter 126 to output node 127. The decoder circuit is the set of elements 120 through 126. Other elements in the circuit are a conventional P-Channel pull up transistor 125, having its drain-source path connected between the control node and the high voltage terminal (vcc) and its gate electrode connected to ground, and an element 128 which represents the noise coupled into node 127 by associated elements inside or outside of the circuit. The size of transistor 125 is selected so that it is a weak transistor having a relatively small current capacity (say 2 microamperes). Thus, in normal operation, the state of node 123 will be determined by the state of node 121, the output of NAND gate 120, and the presence of transistor 125 will have essentially no effect on the operation of the circuit. In order for this to be accomplished of course, as is well known, the current carrying capacity of the path through circuit 120 to ground must dominate the effect of transistor 125. Those skilled in the art will readily be able to devise transistors having appropriate parameters to achieve this conventional result. In a particular example, the current capacity is 2 milliamperes.

If there is a defective element in the row controlled by node 127, then fuse 122 will be blown by a laser, for example, or by the application of a large electrical current or any other conventional means. Decoder 120 is thus effectively isolated from node 123 and pull up transistor 125 brings node 123 to a permanent voltage level of VCC. That, in turn, causes inverter 126 to put node 127 in the conventional logic 0 state to disable the row to which it is attached. An advantage of this method is that inverter 126 has two low impedance states that are a relatively low-impedance path to either VCC or ground, so that any noise coming from box 128 and coupling to this row line will be suppressed by the action of the transistors within inverter 126 and the row controlled by node 127 will not be enabled or disabled by noise, even momentarily.

Figure 4A:
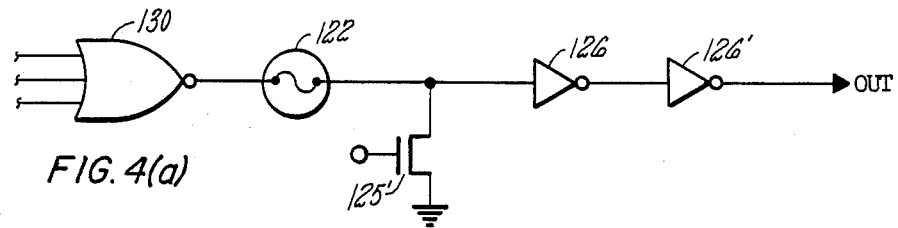
FIGS. 4a–4c illustrate alternative embodiments of the invention.
Figure 4B:
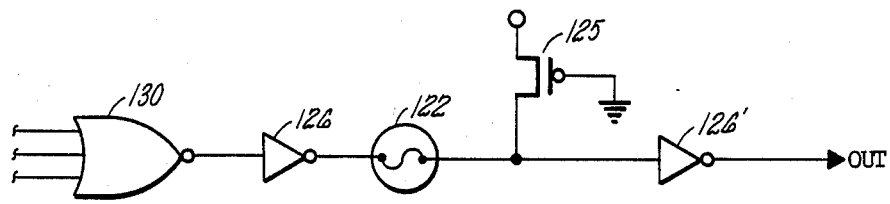

Referring now to FIGS. 4a and 4b, there is shown a pair of alternative embodiments that employ NOR gates 130 instead of NAND gate 120 of FIG. 2. In FIG. 4a, a pull down transistor 125 is used together with an extra inverter 126' to compensate for the effect of the NOR gate instead of the NAND gate. In FIG. 4b, two inverters are also used, but the final stage is that of a pull up transistor 125 after the fuse 122, followed by a single inverter 126. When the fuse is blown, the output stage is equivalent to that in FIG. 3. When the fuse is not blown, then inverter 126 takes over the job of establishing the correct state and overriding the effect of transistor 125.

Figure 4C:
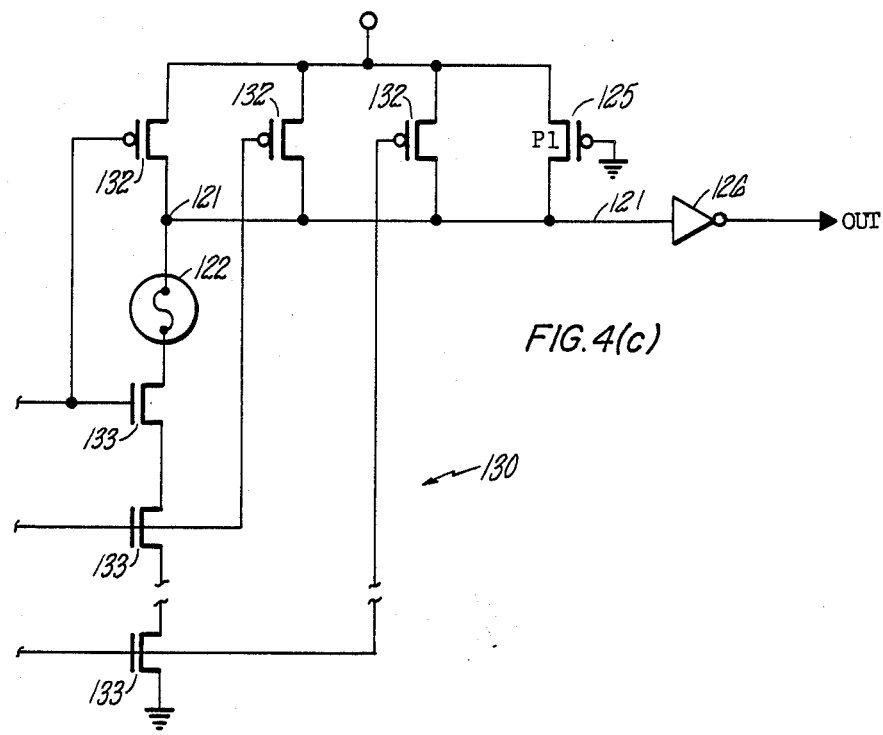

Referring now to FIG. 4c, there is shown the interior of a CMDS NAND gate in which fuse 122 is now placed on the series path from ground through all of the N-Channel transistors 133 to output node 121. P-Channel transistor 132 is arranged to have its source-drain path in parallel between the high voltage terminal and the output mode 121, completing the gate. Fuse 122 performs the function of blocking the signal from the decoder by preventing the transition of node 121 that generates the high going OUT signal. For purposes of this application this effect will also be referred to as blocking the passage at the output signal.

The embodiment of FIG. 3 was adapted to use with a decoder having active-high inputs and an output that is also active-high. FIG. 4c is also adapted to the same conditions. FIGS. 4a and 4b are adapted to a situation in which the inputs are active-low and the output is active-high. Those skilled in the art will readily be able to modify this arrangement for any other desired combination of input and output states.

An important practical advantage of the invention is that it adds very little extra power dissipation in operation. A DC current path exists only when node 123, the input to inverter 126, is pulled low. This only happens in a decoder that is used in the regular array (a regular decoder). All regular decoders that are not active have their node 123 at the normal state of VCC so that no current is drawn through transistor 125. The extra power consumed by the application of this invention is merely the saturation current of one pull up transistor 125, independent of the total number of rows in the memory array or decoders used in other applications of the circuit.

Another advantage of the invention is that capacative coupling and cross talk will be supressed at the decoder output because the decoder output is always connected directly to an inverter. The undesirable prior art circuit of FIG. 2 has a high impedance at the pass transistor gates which is susceptible to noise coupled onto node 127' from some other source.

With respect to the speed at which the circuit operates, the only effect is the slight additional time required to overcome transistor 125 when node 123 is to be driven low. Since transistor 125 is a small transistor, having a small capacitance, this effect is small compared to the delay in operating the conventional circuit illustrated in FIG. 1.

I claim:

1. A row decoder circuit for use in a semiconductive memory comprising an array of storage elements arranged in rows and columns and including redundant rows comprising:

a NAND gate, including a plurality of input terminals, said NAND gate comprising a plurality of N-channel transistors having their drain-source paths connected in series between ground and a first node and an equal number of P-channel transistors having their drain-source paths connected in parallel between a point of high voltage and a second node, the gate electrode of each N-channel transistor being connected to a gate electrode of a respective P-type transistor and to a separate one of said input terminals, a fuse element that is blown open when there is a defective element in the row associated with the decoder circuit having a first terminal connected to said first node and a second terminal connected to said second node, a pull up P-channel transistor having its drain-source path connected between the point of high voltage and said second node and its gate electrode connected to ground, and an inverter having its input connected only to said second node and its output connected only to an output node to be controlled, and characterized in that the current-carrying capacity of the pull-up transistor is small compared to the current-carrying capacity of the current path through the NAND circuit to ground whereby the output node provides a low impedance independent of the state of the fuse.

* * * * *